United States Patent
Tregilgas et al.

[11] Patent Number: 5,804,463
[45] Date of Patent: Sep. 8, 1998

[54] NOBLE METAL DIFFUSION DOPING OF MERCURY CADMIUM TELLURIDE FOR USE IN INFRARED DETECTORS

[75] Inventors: John H. Tregilgas, Richardson; Thomas W. Orent, Garland, both of Tex.

[73] Assignee: Raytheon TI Systems, Inc., Lewisville, Tex.

[21] Appl. No.: 777,861

[22] Filed: Dec. 31, 1996

Related U.S. Application Data

[63] Continuation of Ser. No. 465,151, Jun. 5, 1995.

[51] Int. Cl.$^6$ .................................................. H01L 31/18
[52] U.S. Cl. ........................... 438/67; 438/559; 438/455; 438/518
[58] Field of Search ............... 437/2, 3, 5, 161, 437/247, 160; 257/442; 250/338.4

[56] References Cited

U.S. PATENT DOCUMENTS

| | | | |
|---|---|---|---|
| 3,743,553 | 7/1973 | Scott et al. | 432/3 |
| 4,206,003 | 6/1980 | Koehler | 437/5 |
| 4,345,107 | 8/1982 | Fulop et al. | 136/255 |
| 4,588,446 | 5/1986 | Tregilgas | 437/3 |
| 4,927,773 | 5/1990 | Jack et al. | 437/162 |
| 4,956,304 | 9/1990 | Cockrum et al. | 437/5 |
| 5,075,748 | 12/1991 | Hisa | 437/3 |
| 5,189,297 | 2/1993 | Ahlgren | 437/3 |
| 5,192,695 | 3/1993 | Wawg et al. | 437/5 |
| 5,198,370 | 3/1993 | Ohkura et al. | 437/3 |
| 5,279,974 | 1/1994 | Walsh | 437/3 |
| 5,380,669 | 1/1995 | Norton | 437/3 |
| 5,399,503 | 3/1995 | Saito et al. | 437/5 |
| 5,454,885 | 10/1995 | Dudoff et al. | 437/939 |

FOREIGN PATENT DOCUMENTS

| | | | |
|---|---|---|---|
| 1-220478 | 9/1989 | Japan | 437/5 |
| 2-238675 | 9/1990 | Japan | 437/5 |

*Primary Examiner*—John Niebling
*Assistant Examiner*—S. Mulpuri
*Attorney, Agent, or Firm*—Baker & Botts, L.L.P.

[57] ABSTRACT

A P-type substrate for infrared photo diodes can be produced by the present invention. A CdZnTe substrate is utilized. A first layer of HgCdTe is formed by liquid phase epitaxy on the substrate. A CdTe passivation layer is formed over the HgCdTe. A ZnS layer is formed over the CdTe layer. A noble metal is introduced into either the CdTe or ZnS layers. During a subsequent baking of the composite, the noble metal diffuses throughout the composite and into the HgCdTe layer.

9 Claims, 1 Drawing Sheet

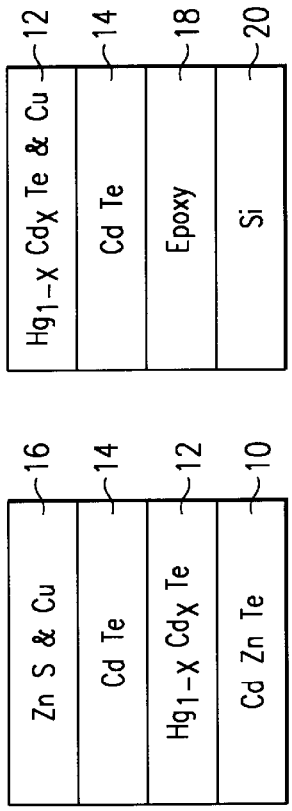
FIG. 1
FIG. 2
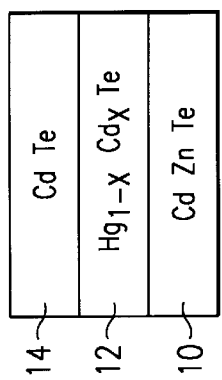
FIG. 3
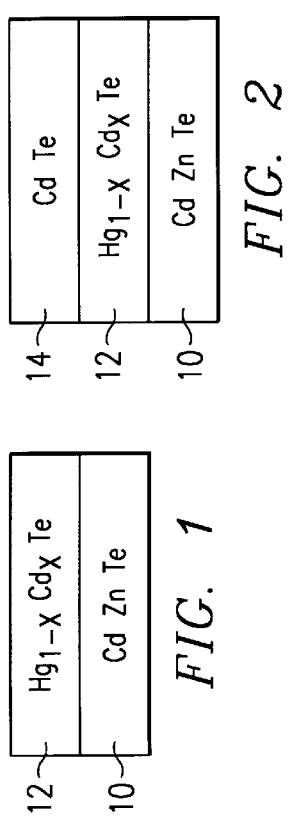
FIG. 4
| Cd Te DOPING: ATORR S/CC | CdTe THICKNESS IN µm | | | | | | | | | |
|---|---|---|---|---|---|---|---|---|---|---|
| | 0.1 | 0.2 | 0.3 | 0.4 | 0.5 | 0.6 | 0.7 | 0.8 | 0.9 | 1 |
| 5.0E+16 | 1.0E+14 | 2.0E+14 | 3.0E+14 | 4.0E+14 | 5.0E+14 | 5.9E+14 | 6.9E+14 | 7.9E+14 | 8.8E+14 | 9.8E+14 |
| 1.0E+17 | 2.0E+14 | 4.0E+14 | 6.0E+14 | 7.9E+14 | 9.9E+14 | 1.2E+15 | 1.4E+15 | 1.6E+15 | 1.8E+15 | 2.0E+15 |
| 5.0E+17 | 1.0E+15 | 2.0E+15 | 3.0E+15 | 4.0E+15 | 5.0E+15 | 5.9E+15 | 6.9E+15 | 7.9E+15 | 8.8E+15 | 9.8E+15 |
| 1.0E+18 | 2.0E+15 | 4.0E+15 | 6.0E+15 | 7.9E+15 | 9.9E+15 | 1.2E+16 | 1.4E+16 | 1.6E+16 | 1.8E+16 | 2.0E+16 |
| 5.0E+18 | 1.0E+16 | 2.0E+16 | 3.0E+16 | 4.0E+16 | 5.0E+16 | 5.9E+16 | 6.9E+16 | 7.9E+16 | 8.8E+16 | 9.8E+16 |
| 1.0E+19 | 2.0E+16 | 4.0E+16 | 6.0E+16 | 7.9E+16 | 9.9E+16 | 1.2E+17 | 1.4E+17 | 1.6E+17 | 1.8E+17 | 2.0E+17 |
| 5.0E+19 | 1.0E+17 | 2.0E+17 | 3.0E+17 | 4.0E+17 | 5.0E+17 | 5.9E+17 | 6.9E+17 | 7.9E+17 | 8.8E+17 | 9.8E+17 |
| 1.0E+20 | 2.0E+17 | 4.0E+17 | 6.0E+17 | 7.9E+17 | 9.9E+17 | 1.2E+18 | 1.4E+18 | 1.6E+18 | 1.8E+18 | 2.0E+18 |
FIG. 5 ns/cm$^3$.

NOBLE METAL DIFFUSION DOPING OF MERCURY CADMIUM TELLURIDE FOR USE IN INFRARED DETECTORS

This application is a Continuation of application Ser. No. 08/465,151, filed Jun. 05, 1995.

FIELD OF THE INVENTION

This invention relates generally to the formation of p-type semiconductor material, and particularly to a method for forming an extrinsicly doped p-type substrate of mercury cadmium telluride having a noble metal diffusion therein.

BACKGROUND OF THE INVENTION

Semiconductors having elements taken from Group II and Group VI of the periodic table of elements, such as mercury, cadmium and tellurium, have been used to good advantage in the fabrication of infrared detectors and imagers which operate in the lower infrared frequency band down to the limits of the available long wave length atmospheric transmission window, i.e., at wavelengths of 8–14 microns. The detection of such long wavelength infrared radiation, if it is to be done using a detector at only moderate cryogenic temperatures, e.g. at liquid nitrogen rather than liquid helium temperatures, is preferably done using a very narrow bandgap semiconductor, such as $Hg_{1-x}Cd_xTe$.

Since HgTe is a semimetal (having a very small negative bandgap) and CdTe has a bandgap of about 0.1 eV, compositions having a small and arbitrarily selectable bandgap may be specified simply by varying the proportions of an alloy having the composition of $Hg_{1-x}Cd_xTe$. Such alloys are here referred to generically as "HgCdTe". For example, for x=0.22 the composition $Hg_{0.78}Cd_{0.22}Te$ has a 10 micron IR cut-off, that is, a composition having a bandgap approximately equal to the photon energy of infrared light having a cut-off wavelength of 10 microns. By reducing the percentage of cadmium, compositions having a smaller bandgap, and therefore a longer operating wavelength, may be produced.

In conventional methods for forming optical detector arrays, p-n junction photodiodes have been used as optical detectors and have been interconnected with various forms of image processing circuitry. In the formation of such arrays, large numbers of p-n junctions are produced by forming n-type regions on the surface of a p-type HgCdTe substrate. The diodes, each formed at a junction of n-type and p-type semiconductor material, form individual photodetectors, and each photodetector defines a pixel within the photodetector array.

In the manufacture of such conventional optical detectors, photodiode junctions have been formed in vacancy doped p-HgCdTe by implantation damage through photographically defined windows into the p-type HgCdTe material, or by converting a thin layer of the p-type HgCdTe material into n-type by appropriate annealing in a saturated Hg atmosphere. At the appropriate annealing temperature, Hg will diffuse through the windows into the substrate and thereby reduce the concentration of metal vacancy acceptor sites in the substrate beneath the windows. Consequently, a surface region of the HgCdTe substrate will convert from p-type to n-type during mercury indiffusion if the impurity donor concentration exceeds the impurity acceptor concentration of the substrate and if the indiffusion temperature and anneal time are chosen to reduce the metal vacancy acceptor concentration below the critical level, fewer than $10^{15}$ carriers/cm$^3$ and preferably approaching $10^{14}$ carriers/cm$^3$.

Intrinsically doped p-type HgCdTe substrates have been formed by liquid phase epitaxy (LPE) and subsequently annealed to remove excess Te and set the vacancy concentration by annealing in saturated Hg vapor at temperatures between about 200°–450° C. Cooling from the anneal temperature would allow the vacancy concentration to relax if cooling was too slow, or more likely, the near surface concentration of vacancies would be reduced by indiffusing Hg. Quenching ampoules with both HgCdTe slices and free Hg can lead to condensation of the Hg at the quartz ampoule wall while the slice is still hot, thereby allowing more Hg to outdiffuse from the HgCdTe and resulting in higher intrinsic acceptor densities near the surface.

Alternatively, either n-type or lightly doped p-type HgCdTe material may be annealed on the Te-rich side of the phase diagram to reduce the anneal temperature necessary to produce a particular vacancy concentration, but vacuum, inert gas or Te-rich annealing of uncapped HgCdTe surfaces can lead to surface decomposition and vapor transport growth of HgTe surface crystals. Another approach has also been used to produce p-type HgCdTe material, namely, using Te-saturated CdTe deposited by sputtering or evaporation. ZnS may be used over the CdTe cap if desired.

OBJECTS OF THE INVENTION

It is a primary object of this invention to produce a p-type HgCdTe material for use in producing photodiodes for sensing infrared radiation which are more sensitive than previously produced photodiodes.

It is a yet another object of this invention to produce a p-type HgCdTe material for use in producing photodiodes for sensing infrared radiation which have lower "dark current" than previously produced photodiodes.

It is still a further object of this invention to produce a p-type HgCdTe material for use in producing photodiodes for sensing infrared radiation which have increased minority carrier lifetime over previously produced photodiodes.

BRIEF DESCRIPTION OF THE INVENTION

P-type HgCdTe according to the present invention is produced by forming by liquid phase epitaxy (LPE) a 100μ layer of HgCdTe on a CdZnTe substrate. High levels of a noble metal (Cu, Au, Ag) are introduced during the evaporation or sputtering of a CdTe passivation layer over the HgCdTe layer. A capping layer of ZnS is formed over the noble metal doped CdTe layer. The capping layer serves as a relatively inert cap to preserve the planarity and cleanliness of the surface below the capping layer. It also provides a barrier to out diffusing of Hg.

The composite so made is then baked at temperatures between about 200°–350° C. for a period ranging from about several hours to several days. During this baking, the noble metal in the CdTe layer will diffuse into the HgCdTe layer. Alternatively, the noble metal may be introduced into the ZnS layer which will diffuse through the CdTe layer into the HgCdTe layer. The concentration of noble metal in the ZnS layer prior to the bake, however, should be somewhat greater than the concentration of noble metal in the CdTe layer of the first mentioned approach since it is more difficult to affect diffusion of the noble metal dopant in the ZnS.

DESCRIPTION OF THE DRAWINGS

The foregoing and other objects, advantages and features of the present invention are described below in connection with the drawings wherein:

FIG. 1 is a simplified diagram which shows a CdZnTe substrate with a 100μ thick layer of $Hg_{1-x}Cd_xTe$ formed thereon;

FIG. 2 is a simplified diagram which shows the structure of FIG. 1 with a 0.2μ layer of CdTe with excess Te formed thereon;

FIG. 3 is a simplified diagram which shows the structure of FIG. 2 with a 0.2–0.3μ capping layer of ZnS with Cu doping;

FIG. 4 is a simplified diagram which shows the structure of FIG. 3 after removal of the ZnS capping layer and bonding the structure inverted to a Si substrate;

FIG. 5 is a table describing the noble metal dopant concentrations in the CdTe based on CdTe layer thickness required to achieve given levels of noble metal dopant concentrations in the LPE layer.

DETAILED DESCRIPTION

The method for fabricating a p-type HgCdTe layer according to the present invention begins with an CdZnTe substrate 10 having a thickness of about 0.1–0.15 cm. This substrate has low dislocation density of about $2–5\times10^5$ $cm^2$ and a concentration of Zn between about 2.5–5.0 atomic %.

Over the CdZnTe substrate 10, a 100μ layer 12 of $Hg_{1-x}Cd_xTe$ is formed by liquid phase epitaxy (LPE) in a fashion well known in the art. In this LPE layer, the value of x is preferably in the range of between 0.18 and 0.4 with the preferred value being 0.225. After the 100μ layer 12 of $Hg_{1-x}Cd_xTe$ is formed, the structure is annealed in an Hg atmosphere to increase the Hg content of the layer 12 ever so slightly. This anneal is started at about 400° C. for about 2–4 hours which eliminates excess Te. Then, the temperature is lowered to about 220° C. for a period of about 24 hours. The resulting structure is illustrated in FIG. 1, although this figure is not drawn to scale.

After the anneal, the 100μ layer 12 of $Hg_{1-x}Cd_xTe$ is planarized and polished. In this process, the thickness is reduced to about 40–50μ. Planarization may be performed by many known techniques, however, diamond turning (a milling process) is the preferred planarization method. The polishing is performed by chem-mechanical techniques using Br-methanol etching solutions although other known polishing methods such as hydroplane polishing may also be utilized.

Once the structure of FIG. 1 has been planarized and polished, a Te-rich CdTe layer 14 of approximately 0.2μ in thickness is formed over the $Hg_{1-x}Cd_xTe$ layer 12 as illustrated in FIG. 2. As used herein, the term "Te-rich" means the presence of tellurium in a mole fraction which exceeds the amount of cadmium found in the stoichiometric solid phase of CdTe (i.e., where $Cd_xTe_{1-x}$, x<0.5). That is, Te second phase is present in the solid phase of Te-rich $Cd_xTe_{1-x}$. Preferably, the layer 14 is deposited by evaporation of CdTe to yield CdTe plus Te, with the excess Te being present as a precipitate in an amount of from about one (1) atomic percent to about twenty (20) atomic percent. Other methods may be utilized to form layer 14 such as by sputtering CdTe to yield CdTe plus excess Te, by hot-wall epitaxy (HWE), by molecular beam epitaxy (MBE) and by MOCVD.

As illustrated in FIG. 3, a capping layer 16 of ZnS is formed over the CdTe layer 14. This capping layer 16 in the preferred embodiment of the invention includes noble metal doping with Cu. The doping levels of Cu in the ZnS layer 16 is in the order of about $10^{18}–10^{19}$ atoms/cc where the thickness of the $Hg_{1-x}Cd_xTe$ is approximately 50μ. The doped capping layer 16 is preferably formed by sputtering although other methods for forming such a layer may be used. In the preferred arrangement, the noble metal doped layer 16 has a thickness of about 0.2μ.

Once the structure of FIG. 3 has been formed, it is then baked at a temperature of between 200°–350° C. The time of the bake is dependent on the temperature. The higher the temperature, the shorter the baking time required to cause sufficient interdiffusion of CdTe and HgCdTe. Here, Cd from layer 14 diffuses into the LPE layer 12 and Hg diffuses from layer 12 to layer 14. Also, during the baking process, the Cu in the ZnS layer 16 readily diffuses throughout the structure. The bake time at 300° C. is on the order of hours to a day or so while the bake time at 250° C. is on the order of one to several days. In the final structure of FIG. 3 after the bake, it is desirable to have Cu in a concentration of from about $1\times10^{16}$ to about $5\times10^{17}$ atoms/cc within the HgCdTe layer 12. We have had good results at copper concentrations of $3\times10^{16}$ atoms/cc.

Due to the mobility of Cu during the baking process, those of skill in the art will readily recognize that copper does not have to be introduced into the ZnS layer 16 but that copper could be introduced into the CdTe layer 14 instead. The doping level of Cu within the CdTe layer 14 preferably would be in the range of $10^{18}–10^{19}$ atoms/cc. For specific doping concentrations of Cu, specific reference is made to FIG. 5 which illustrates the achieved doping level of Cu in the LPE film 12 as a function of the CdTe layer 14 thickness and the doping level of copper therein. In the event the copper doping is to be put in the ZnS layer 16, however, the values shown in FIG. 5 are a close approximation of the desired doping concentration although it is believed that increasing the table concentration values by about 10% above those shown for the CdTe layer will yield the ultimate concentrations shown in the table for the HgCdTe layer 12.

Those of skill in the art will recognize that while the above description has dealt with a process which includes diffusion of copper into the HgCdTe layer 12, other noble metals such as gold and silver may also be utilized for this purpose as well. The concentrations of these metals in either the ZnS or CdTe layers prior to diffusion need to be determined as they will be somewhat different from the results indicated in FIG. 5 for copper. However, the final doping concentration of noble metal in the HgCdTe layer 12 after the process is complete should be in the same general concentration range as those indicated earlier for copper.

Once the structure of FIG. 3 has been baked and the desired doping levels in the HgCdTe created, the ZnS is removed. The exposed CdTe layer 14 is then bonded using a suitable epoxy 18 to a silicon substrate 20. The CdZnTe substrate 10 is removed and the remaining HgCdTe is planarized until the layer 12 has a thickness on the order of about 6–20μ. By adjusting the doping as specified above, the resulting HgCdTe comprises a p-type layer in which a shallow n-type impurity can be implanted to create the p-n junction for a photo diode. In the preferred embodiment of the invention, the implanting is performed by an ion implanter using a boron source and a dose in the range of about $5\times10^{14}$ Boron/$cm^2$ in the manner well known in the prior art. Subsequently, the junction is formed in a conventional baking process usually in the range of about 100° to 140° C. for several hours to several days.

Testing of the photo diodes produced by this invention have shown increased performance over photo diodes produced by essentially the same method but without the inclusion of a noble metal in the manner described above. Indeed, the photo diodes with noble metal according to the invention have been measured to have improved sensitivity, lower "dark" current and increased minority carrier lifetime.

While the foregoing description has been made with reference to the drawings which illustrate the preferred embodiment of the invention, those of skill in the art will recognize that the foregoing and other modifications to the process may be made without departing from the spirit and scope of the present invention as defined by the following claims.

What is claimed is:

1. A method for producing infrared photo diodes, the method comprising the steps of:

providing a substrate of CdZnTe;

forming a layer of $Hg_{1-x}Cd_xTe$ on said substrate, where x is between 0.18 and 0.40;

forming a CdTe layer on said layer of $Hg_{1-x}Cd_xTe$;

forming a layer of ZnS over said CdTe layer, wherein said CdTe layer or said ZnS layer being doped with a noble metal; and baking said substrate, $Hg_{1-x}Cd_xTe$ layer, CdTe, and ZnS layer to diffuse the noble metal from said CdTe layer or said ZnS layer to said $Hg_{1-x}Cd_xTe$ layer to form a p-type HgCdTe layer having a concentration of noble metal atoms in the range of between about $1\times10^{16}$ and $5\times10^{17}$ atoms/cc throughout said p-type HgCdTe layer, wherein said baking step is performed at a temperature of between 200° C. and 350° C. for as long as several hours to several days depending on the temperature;

removing said ZnS layer, thereby forming a structure with an exposed CdTe layer;

bonding said exposed CdTe layer to a silicon substrate;

removing said CdZnTe substrate, thereby exposing said p-type HgCdTe layer; and forming a photodiode by implanting portions of said p-type HgCdTe layer with an n-type impurity.

2. The method of claim 1 wherein said noble metal is copper.

3. The method of claim 2, wherein a concentration of copper atoms is about $3\times10^{16}$ atoms/cc.

4. The method of claim 1, wherein said CdZnTe substrate comprises $Cd_{1-y}Zn_yTe$ where y is between 0.025 and 0.05.

5. The method of claim 1, wherein said CdTe layer has a Cd/Te atomic ratio between 0.8 and 1.0.

6. The method of claim 1, wherein said noble metal is gold.

7. The method of claim 1, wherein said noble metal is silver.

8. The method of claim 1, wherein the concentration of said noble metal in said CdTe layer or said ZnS layer is between about $10^{18}$ and $10^{19}$ atoms/cc.

9. The method of claim 1, wherein said n-type impurity is boron.

* * * * *